US009029272B1

(12) United States Patent
Nakano et al.

(10) Patent No.: US 9,029,272 B1
(45) Date of Patent: May 12, 2015

(54) METHOD FOR TREATING SIOCH FILM WITH HYDROGEN PLASMA

(71) Applicant: ASM IP Holding B.V., Almere (NL)

(72) Inventors: Akinori Nakano, Tokyo (JP); Shintaro Ueda, Tama (JP); Dai Ishikawa, Ome (JP); Kiyohiro Matsushita, Fuchu (JP)

(73) Assignee: ASM IP Holding B.V., Almere (NL)

( * ) Notice: Subject to any disclaimer, the term of this patent is extended or adjusted under 35 U.S.C. 154(b) by 0 days.

(21) Appl. No.: 14/069,244

(22) Filed: Oct. 31, 2013

(51) Int. Cl.
*H01L 21/02* (2006.01)

(52) U.S. Cl.
CPC .... *H01L 21/02126* (2013.01); *H01L 21/02271* (2013.01); *H01L 21/0228* (2013.01); *H01L 21/02282* (2013.01); *H01L 21/0234* (2013.01)

(58) Field of Classification Search
USPC .......................................... 438/783, 424, 787
See application file for complete search history.

(56) References Cited

U.S. PATENT DOCUMENTS 7,771,796 B2 * 8/2010 Kohno et al. ................. 427/535
2011/0281417 A1 * 11/2011 Gordon et al. ................. 438/424

OTHER PUBLICATIONS

IBM Research Report, The Effect of Plasma Chemistry on the Damage Induced to Porous SiCOH Dielectrics, by A. Gril and V. Patel, IBM Research Division, T.J. Watson Research Center, Yorktown Heights, New York, RC23683 Aug. 1, 2005, Materials Science, pp. 1-19.

Journal of Applied Physics 97, 113302 (2005), Impact of Reductive N2/H2 Plasma on Porous Low-Dielectric Constant SiCOH Thin Films, by Hao Cui, Richard J. Carter, Darren L. Moore, Hua-Gen Peng, David Gidley and Peter Burke, Published May 25, 2005, pp. 1-8.

* cited by examiner

*Primary Examiner* — Mamadou Diallo
(74) *Attorney, Agent, or Firm* — Snell & Wilmer LLP

(57) ABSTRACT

A method for forming a gap-fill SiOCH film on a patterned substrate includes: (i) providing a substrate having recessed features on its surface; (ii) filling the recessed features of the substrate with a SiOCH film which is flowable and non-porous; (iii) after completion of step (ii), exposing the SiOCH film to a plasma including a hydrogen plasma; and (iv) curing the plasma-exposed SiOCH film with UV light.

17 Claims, 7 Drawing Sheets

METHOD FOR TREATING SIOCH FILM WITH HYDROGEN PLASMA

BACKGROUND OF THE INVENTION

1. Field of the Invention

The present invention generally relates to technology of forming interlayer dielectric films for multilayer interconnection for semiconductor integrated circuits, particularly to a method for forming a gap-fill carbon-doped silicon oxide (SiOCH) film on a patterned surface of a substrate where recessed features between wiring lines are narrow.

2. Description of the Related Art

In recent years, the development of semiconductor devices has been remarkable, and has achieved high integration, high speed, and high capacity, and accordingly, the miniaturization of interconnection of semiconductor circuits has progressed. As the miniaturization of interconnection progresses, signal delay and increase in power consumption associated with increase of wiring capacitance especially in a multilayer wiring structure have become a problem. To solve the problem, an insulation film with a low dielectric constant, which is a SiOCH film, is used as a multilayer interconnection dielectric film so as to reduce capacitance between wiring lines. Further, copper is used as a wiring material for reducing resistivity to improve signal delay. The typical method for forming multilayer interconnection using the SiOCH film and copper is the damascene method.

The damascene method is accomplished by firstly depositing a SiOCH film, and then forming a trench or a via hole in the SiOCH film by an exposure/etching process, and then embedding copper in the trench or the via hole. The damascene method has been the main technology of low-k film multilayer interconnection for a long time. However, as the miniaturization of interconnection has further progressed, the resistance of copper as the wiring material rises according to the width of the interconnection, and therefore the advantage of using copper has diminished. By its nature, copper easily defuses in the SiOCH film, and therefore when copper is used as the wiring material, a complicated process to prevent copper from diffusing in the SiOCH film is required. Therefore, tungsten, which has traditionally been used as a wiring material, draws attention as a new wiring material in multilayer connection structures. If tungsten is used as the wiring material, the complicated process is not required, and process cost is reduced by a simplified process.

When tungsten is used as the wiring material, the damascene method is not necessary due to the fact that tungsten is easy to etch as compared with copper, and a conventional method of first forming metal wiring and then forming interlayer interconnection dielectric film between metal wiring lines can be used. In this case, since extremely narrow intervals are formed between metal wiring lines, the intervals are not filled completely by the conventional CVD method, and accordingly voids and the like are formed in the interlayer dielectric film. In order to solve the problem of void formation, a flowable CVD method, ALD method, and spin-coat method have been developed. After a SiOCH film is formed by those methods, UV-curing process is conducted on the SiOCH film so as to lower the dielectric constant and stabilize the SiOCH film.

However, after tungsten wiring is complete, followed by filling intervals between the wiring lines with a SiOCH film by flowable CVD, ALD, or spin coating, when UV-curing is conducted for lowering dielectric constant and stabilization of the film, film shrinkage occurs. If film shrinkage is significant, disconnection of wiring lines and collapse of wiring lines occur due to shrinking force. Further, cracks of the film itself may occur.

Conventionally, the above problem is solved by "annealing" the film for stabilizing the film to a certain degree at a relatively low temperature such as 50° C. to 100° C. or at a temperature increasing gradually or stepwise, prior to high-temperature UV-curing. However, once the film is heated, film shrinkage during high-temperature UV-curing remains high and is not significantly improved.

Any discussion of problems and solutions involved in the related art has been included in this disclosure solely for the purposes of providing a context for the present invention, and should not be taken as an admission that any or all of the discussion were known at the time the invention was made.

SUMMARY OF THE INVENTION

Some embodiments provide technology to form a gap-fill dielectric film constituted by a SiOCH film exhibiting low film-shrinkage during high-temperature UV-curing and therefore to inhibit disconnection of wiring lines and cracks of the dielectric film, which SiOCH film is deposited by flowable CVD, ALD, spin coating, or the like.

In some embodiments, a method for forming a gap-fill SiOCH film on a patterned substrate comprises: (i) providing a substrate having recessed features on its surface; (ii) filling the recessed features of the substrate with a SiOCH film which is flowable and non-porous; (iii) after completion of step (ii), exposing the SiOCH film to a plasma including a hydrogen plasma; and (iv) curing the plasma-exposed SiOCH film with UV light.

For purposes of summarizing aspects of the invention and the advantages achieved over the related art, certain objects and advantages of the invention are described in this disclosure. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

Further aspects, features and advantages of this invention will become apparent from the detailed description which follows.

BRIEF DESCRIPTION OF THE DRAWINGS

These and other features of this invention will now be described with reference to the drawings of preferred embodiments which are intended to illustrate and not to limit the invention. The drawings are greatly simplified for illustrative purposes and are not necessarily to scale.

DETAILED DESCRIPTION OF EMBODIMENTS

Figure 1:
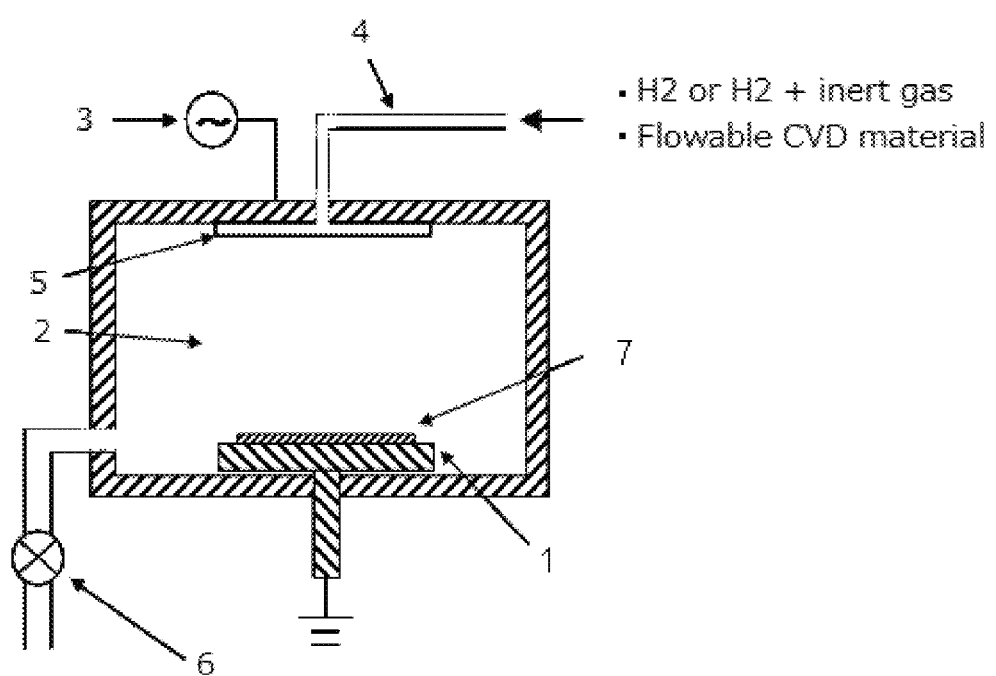
FIG. 1 is a schematic view of a plasma processing apparatus usable in an embodiment of the present invention.

In this disclosure, "gas" may include vaporized solid and/or liquid and may be constituted by a single gas or a mixture of gases. Likewise, an article "a" or "an" refers to a species or a genus including multiple species. In this disclosure, a gas may be introduced to a reaction chamber through a showerhead. Different gases can be introduced as a mixed gas or separately to a reaction space. A primary gas can be introduced with a carrier gas or dilution gas such as a rare gas. A gas other than a primary gas, i.e., a gas introduced without passing through the showerhead, may be used for, e.g., sealing the reaction space, which includes a seal gas such as a rare gas. In some embodiments, "film" refers to a layer continuously extending in a direction perpendicular to a thickness direction substantially without pinholes to cover an entire target or concerned surface, or simply a layer covering a target or concerned surface. In some embodiments, "layer" refers to a structure having a certain thickness formed on a surface or a synonym of film or a non-film structure. A film or layer may be constituted by a discrete single film or layer having certain characteristics or multiple films or layers, and a boundary between adjacent films or layers may or may not be clear and may be established based on physical, chemical, and/or any other characteristics, formation processes or sequence, and/or functions or purposes of the adjacent films or layers. Further, in this disclosure, any two numbers of a variable can constitute an workable range of the variable as the workable range can be determined based on routine work, and any ranges indicated may include or exclude the endpoints. Additionally, any values of variables indicated (regardless of whether they are indicated with "about" or not) may refer to precise values or approximate values and include equivalents, and may refer to average, median, representative, majority, etc. in some embodiments.

In the present disclosure where conditions and/or structures are not specified, the skilled artisan in the art can readily provide such conditions and/or structures, in view of the present disclosure, as a matter of routine experimentation.

In all of the disclosed embodiments, any element used in an embodiment can be replaced with any elements equivalent thereto, including those explicitly, necessarily, or inherently disclosed herein, for the intended purposes. Further, the present invention can equally be applied to apparatuses and methods.

In this disclosure, any defined meanings do not necessarily exclude ordinary and customary meanings in some embodiments.

The embodiments will be explained with respect to preferred embodiments. However, the present invention is not limited to the preferred embodiments In some embodiments, a method for forming a gap-fill SiOCH film on a patterned substrate, comprises: (i) providing a substrate having recessed features on its surface; (ii) filling the recessed features of the substrate with a SiOCH film which is flowable and non-porous; (iii) after completion of step (ii), exposing the SiOCH film to a plasma including a hydrogen plasma; and (iv) curing the plasma-exposed SiOCH film with UV light.

The SiOCH film is a carbon-doped silicon oxide film which is a dielectric film constituted by a matrix formed substantially by Si, O, C, and H and/or characterized substantially by Si, O, C, and H, with or without one or more other elements doped therein. The SiOCH film is flowable and non-porous so that it is capable of fully filling recessed features of a substrate and further accumulating over the recessed features. The flowable SiOCH film is nearly gelatinous and permeable, and thus, hydrogen ions and radicals included in a plasma can penetrate the SiOCH film deeply. The dielectric film may have a dielectric constant of about 1.9 to about 5.0, typically about 2.1 to about 3.5, preferably less than 2.5. In some embodiments, the dielectric film is formed in recessed features such as trenches or vias including side walls and bottom surfaces, and/or flat surfaces, by flowable CVD or any other equivalent thin film deposition methods such as atomic layer deposition (ALD) and spin coating. Typically, the thickness of the dielectric film is in a range of about 50 nm to about 500 nm (a desired film thickness can be selected as deemed appropriate according to the application and purpose of film, etc.). The flowable CVD process is a process to deposit by CVD a liquid-like film that flows substantially freely into gaps such as trenches and vias with a high aspect ratio (e.g., an aspect ratio of 1:0.06 to 1:8 where the height is 300 nm while the width varies from 40 to 5,000 nm) and fills the gaps from their bottom substantially without voids (prior to curing). A skilled artisan can readily form a flowable SiOCH film on recessed features of a substrate. For example, a flowable SiOCH film can be formed under conditions shown in Table 1 below.

TABLE 1

| (the numbers are approximate) | |
|---|---|
| Precursor | Diethoxymethylsilane; 5 to 340 sccm, typically 54 sccm |
| Oxidant | O2; 5 to 200 sccm; typically 102 sccm |
| Dilution gas | He; 0 to 500 sccm; typically 0 sccm |
| Temperature | 50° C. or lower; typically 20° C. |
| Pressure | 100 to 1,200 Pa; typically 500 Pa |
| Distance between electrodes | 6 to 27 mm; typically 9 mm |
| RF power | 13.56 MHz; 30 to 500 W for 300-mm wafer (0.042 to 0.71 W/cm$^2$); typically 100 W (0.14 W/cm$^2$) |

After completion of step (ii) (deposition of flowable SiOCH film), but prior to step (iv) (UV-curing), the SiOCH film is exposed to a plasma including a hydrogen plasma. In some embodiments, in step (iii), the hydrogen plasma is a plasma of a hydrogen-containing gas. In some embodiments, the hydrogen-containing gas is a gas containing hydrogen in its molecule, which gas is at least one selected from the group consisting of $H_2$, $CH_4$, $C_2H_6$, $C_3H_8$, $C_4H_{10}$, $C_2H_2$, $C_2H_4$, and $NH_3$. The SiOCH film deposited in recessed features contains residual gas components which may be reaction byproducts and does not have sufficient Si—O bonds in the film matrix. By exposing the SiOCH film to a hydrogen plasma, the residual gas components can be removed, and the quantity of Si—O bonds can be increased, thereby strengthening the film matrix prior to UV-curing, and inhibiting shrinkage of the film during UV-curing. For example, by exposing the SiOCH film to a hydrogen plasma prior to high temperature UV-curing (UV-curing at a temperature of about 300° C. and about 400° C.), film shrinkage can be reduced to about 50% of that without using a hydrogen plasma, and leak current of the film can be reduced to 1/10 of that without using a hydrogen plasma. Further, without the hydrogen plasma treatment, many voids (having a size of, e.g., about 20 nm or greater) may be formed due to shrinkage during UV-curing, whereas with the hydrogen plasma treatment, substantially no voids may be formed due to controlled shrinkage. In some embodiments, in step (iii) (hydrogen plasma treatment), the plasma consists of the hydrogen plasma. In some embodiments, the flow rate of the hydrogen-containing gas is about 100 sccm to about 5000 sccm (typically about 300 sccm to about 1000 sccm).

In some embodiments, in step (iii), the plasma further comprises an inert gas plasma. In some embodiments, the inert gas plasma is a plasma of nitrogen gas and/or rare gas. In some embodiments, the rare gas is He, Ar, Ne, Kr, and/or Xe. In some embodiments, the flow rate of the inert gas is about 0 sccm to about 5000 sccm (typically about 0 sccm to about 500 sccm). The ratio of hydrogen-containing gas flow to inert gas flow may be about 0 to about 10, typically about 0 to about 5. In some embodiments, in step (iii), no precursor gas for depositing a film is supplied, and no oxidizing gas is supplied.

In some embodiments, the substrate is loaded on a susceptor, and a temperature of the susceptor is controlled at $-10°$ C. to $50°$ C. in step (iii). In some embodiments, the temperature of the susceptor in step (iii) is room temperature or lower. In some embodiments, the substrate is placed between electrodes, and in step (iii), the plasma is generated by applying RF power between the electrodes at a power of 0.07 W to 3 W per $cm^2$ of the substrate (typically 0.2 W to 2 W per $cm^2$ of the substrate). In some embodiments, the frequency of RF power is 13.56 MHz, 27.12 MHz, or 60 MHz. In some embodiments, in step (iii), the substrate is placed between electrodes, and a distance between the electrodes is about 6 mm to about 27 mm (typically 6 mm to 14 mm). In some embodiments, step (iii) is conducted under a pressure of 100 Pa to 1 ATM (typically 500 Pa to 1200 Pa). In some embodiments, a gas for generating a plasma is introduced to the reaction space through a showerhead, the temperature of which is controlled at room temperature to $200°$ C. (typically $100°$ C. to $180°$ C.). The above temperatures are measured at a susceptor provided in a chamber, wherein the susceptor is equipped with a cooling system. In some embodiments, the duration of step (iii) is about 30 seconds to about 1800 seconds (typically about 60 seconds to about 900 seconds). By conducting step (iii), the film shrinkage during UV-curing can be reduced to about 10% or less, regardless of the type of UV lamp and the wavelength of UV light used for UV-curing.

In some embodiments, steps (ii) (deposition of flowable SiOCH film) and (iii) (hydrogen plasma treatment) are conducted in the same reaction chamber (in-situ hydrogen plasma treatment). In the above, steps (ii) and (iii) can be continuously conducted. In the above, "continuously" refers to without breaking a vacuum, without interruption as a timeline, without changing common treatment conditions, immediately thereafter, or as a next step. Alternatively, steps (ii) and (iii) can be conducted in different reaction chambers (ex-situ hydrogen plasma treatment).

In some embodiments, the method further comprises, after completion of step (ii) but prior to step (iii), exposing the SiOCH film to aminosilane gas without a plasma. This step may be referred to as "aminosilane annealing". Since highly flowable SiOCH film contains many unstable groups (such as alcohol groups, hydroxyl groups), by introducing aminosilane, the unstable groups can be replaced with stable Si-Me groups or Si—O bonds can be formed via aminosilane, thereby reducing the amount of components which are disassociated and removed during a curing step and strengthening the skeleton including Si—O bonds, and as a result, increasing the quantity of components including Si—O bonds, suppressing shrinkage of film, and increasing the film strength in combination with step (iii).

In some embodiments, the aminosilane annealing is conducted under conditions where the temperature of the substrate is controlled at about $0°$ C. to about $200°$ C. (typically about $0°$ C. to about $100°$ C.), the pressure is controlled at about 0.5 Pa to the standard atmospheric pressure (typically about 500 Pa to about 12000 Pa), the duration of the aminosilane annealing is about one second to about 60 minutes (typically about 30 seconds to about 5 minutes), and the concentration of aminosilane in the atmosphere to which the film is exposed is about 100 ppm to 100% (typically about 10% to about 100%) wherein an inert gas such as rare gas and/or nitrogen gas which is not reactive to aminosilane can be used as an additive gas or a carrier gas. Once aminosilane is loaded to the chamber where the substrate is placed, the gas need not be continuously supplied to the chamber throughout the aminosilane annealing.

In some embodiments, aminosilane may be one or more organoaminosilane selected from the group consisting of bis-diethylamino silane (BDEAS), bisdiethylamino methylsilane (BDEAMS), bisdiethylamino dimethylsilane (BDEADMS), bisdimethylaminosilane (BDMAS), bisdimethylamino methylsilane (BDMADMS), bisdimethylamino dimethylsilane (BDMADMS), bistert-butylaminosilane (BTBAS), dimethylamino trimethylsilane (DMATMS), dimethylamino dimethylsilane (DMADMS), diethylamino trimethylsilane (DEATMS), diethylamino dimethylsilane (DEADMS), tert-butylaminosilane (TBAS), tert-butylamino trimethylsilane (TBATMS), disec-butylaminosilane (DSBAS), trisdimethylaminosilane (TDMAS), trisdimethylaminomethylsilane (TDMAMS), bistrimethylsilylamine (BTMSA), bistrimethylsilylmethylamine (BTMSMA), bisdimethylsilylamine (BDMSA), bisdimethylsilylmethylamine (BDMSMA), tristrimethylsilylamine (TTMSA), trisdimethylsilylamine (TDMSA), and a derivative of the foregoing. In some embodiments, aminosilane includes organosilazane such as alkyl-substituted disilazane, alkyl-substituted trisilazane, alkyl-substituted tetrasilazane, alkyl-substituted polysilazane, alkyl-substituted silazane, alkyl-substituted cyclotrisilazane, alkyl-substituted cyclotetrasilazane, and a derivative of the foregoing.

After step (ii) (deposition of flowable SiOCH film), with or without the aminosilane annealing, UV-curing is conducted. In some embodiments, UV-curing may be conducted by irradiating the SiOCH film with UV light at temperature of $200°$ C. to $400°$ C., typically about $300°$ C. to about $400°$ C. ("high-temperature UV-curing"). The UV light used for the high-temperature UV-curing can have wide ranges of wavelength (typically a wavelength of 400 nm or less, e.g., about 170 nm to about 300 nm) and an illumination intensity of less than about 150 $W/cm^2$ (typically about 25 $W/cm^2$ to about 100 $W/cm^2$). The high-temperature UV-curing can be conducted using any suitable UV lamp including an Xe lamp and other conventional lamps. In some embodiments, the high-temperature UV-curing is conducted for a duration of e.g., about 10 seconds to about 600 seconds, typically about 30 seconds to about 180 seconds, depending on the thickness of the film, etc. in an atmosphere where $N_2$, He, or Ar flows at 0.1 to 10 SLM under a pressure of 200 Pa to 1 ATM.

In this disclosure, "curing" refers to a process during which a chemical reaction (such as polymerization or crosslinking) and/or physical action (such as vaporization or removing volatile components) take(s) place, resulting in a harder, tougher, and/or more stable linkage of film matrix. In this disclosure, "annealing" refers to a process during which a material is treated to become its stable form, e.g., a terminal group (such as an alcohol group and hydroxyl group) present in a component is replaced with a more stable group (such as a Si-Me group) and/or forms a more stable form (such as a Si—O bond). In some embodiments, the curing and the annealing are defined as mutually exclusive processes. Typically in the annealing and the curing, substantially no film is formed on the substrate.

FIG. 1 is a schematic view of an apparatus combining a flowable CVD reactor and flow control valves, desirably in conjunction with controls programmed to conduct the sequences described herein, which can be used in an embodiment of the present invention. The flowable CVD reactor can be used for the hydrogen plasma treatment. A skilled artisan will appreciate that the apparatus includes one or more controller(s) (not shown) programmed or otherwise configured to cause the deposition and reactor cleaning processes described elsewhere herein to be conducted. The controller(s) are communicated with the various power sources, heating systems, pumps, robotics and gas flow controllers or valves of the reactor, as will be appreciated by the skilled artisan.

The temperature of a susceptor 1 equipped with a cooling system is set in advance at 50° C. or lower, preferably 30° C. or lower, and a substrate 7 (e.g., a 300-mm silicon wafer with recessed features on its surface) is placed on the susceptor 1. A process gas for flowable CVD is then supplied to a reaction chamber 2 through a showerhead 5 via a gas inlet pipe 4. At this time, the pressure inside the reaction chamber 2 is set at 100 Pa to 1,200 Pa, preferably 300 Pa to 500 Pa, by using a pressure adjusting valve 6. RF power from an RF source 3 is then applied to the showerhead 5, thereby depositing a flowable SiOCH film on the substrate 7. Continuously, without removing the substrate 7 from the reaction chamber 2, hydrogen or a mixture of hydrogen and dilution gas is introduced into the reaction chamber 2 through the gas inlet pipe 4, and simultaneously the pressure inside the reaction chamber 2 is adjusted at 100 Pa to 1 ATM by using the pressure adjusting valve 6, and RF power from the RF source 3 is applied to the showerhead at 0.07 W/cm$^2$ to 3 W/cm$^2$, thereby conducting the hydrogen plasma treatment.

Alternatively, after depositing a flowable SiOCH film, the substrate 7 is removed from the reaction chamber 2, and transferred to another reaction chamber, and then, similarly to the above, hydrogen or a mixture of hydrogen and dilution gas is introduced into the other reaction chamber, the pressure is adjusted, and RF power is applied at 0.07 W/cm$^2$ to 3 W/cm$^2$, thereby conducting the hydrogen plasma treatment.

EXAMPLES

In the following examples where conditions and/or structures are not specified, the skilled artisan in the art can readily provide such conditions and/or structures, in view of the present disclosure, as a matter of routine experimentation.

A SiOCH film was deposited on a bare silicon substrate (0300 mm) by PECVD under conditions shown in Table 2 below using the PECVD apparatus illustrated in FIG. 1. The substrate had trenches having an opening width of about 40 nm and an aspect ratio of 1:7.5. The thickness of film was 350 nm for evaluating film properties.

TABLE 2

| | |
|---|---|
| Precursor | Diethoxymethylsilane; 54 sccm |
| Oxidant | O2; 102 sccm |
| Dilution gas | He; 0 sccm |
| Temperature | 20° C. |
| Pressure | 500 Pa |
| Distance between electrodes | 9 mm |
| RF power | 13.56 MHz; 100 W (0.14 W/cm$^2$) |

Comparative Example 1

One-Step High-Temperature UV-Curing

UV-curing was conducted on the film-deposited substrate under conditions shown in Table 3 below.

TABLE 3

| | |
|---|---|
| Substrate Temperature | 380° C. |
| Process Pressure | 665 Pa |
| Gas flow of N$_2$ | 4 SLM |
| Distance between Lamp and Substrate | 38 mm |
| UV Lamp | Excimer (172 nm) |
| Duration of UV irradiation | 0 to 80 seconds |

Figure 2:
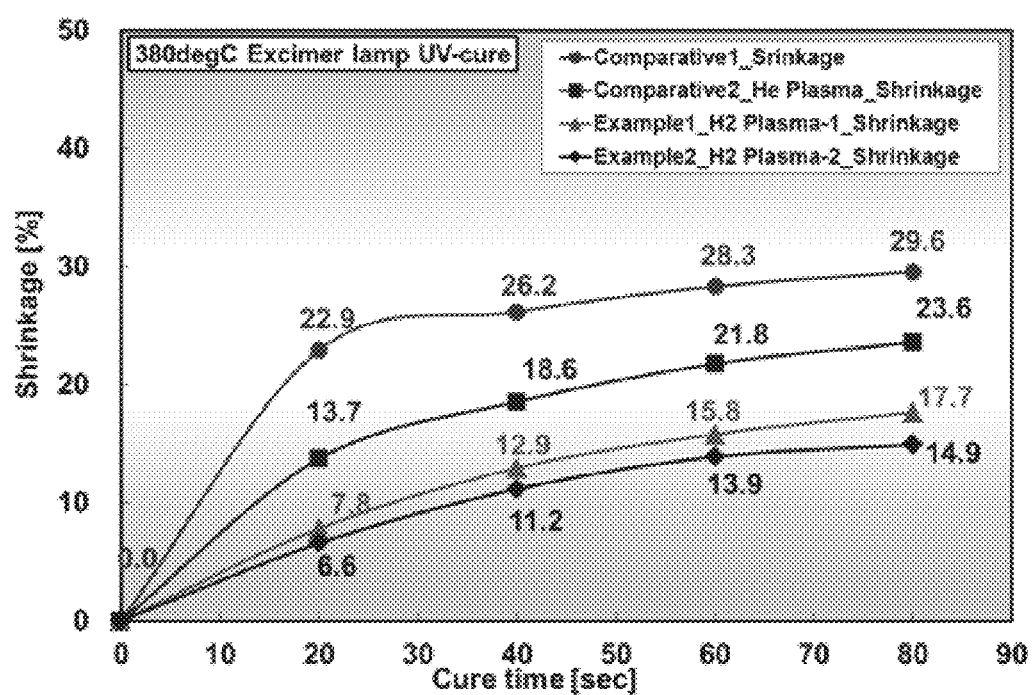
FIG. 2 is a graph showing the relationship between shrinkage [%] and cure time [sec] according to Examples 1 and 2 and Comparative Examples 1 and 2.
Figure 4:
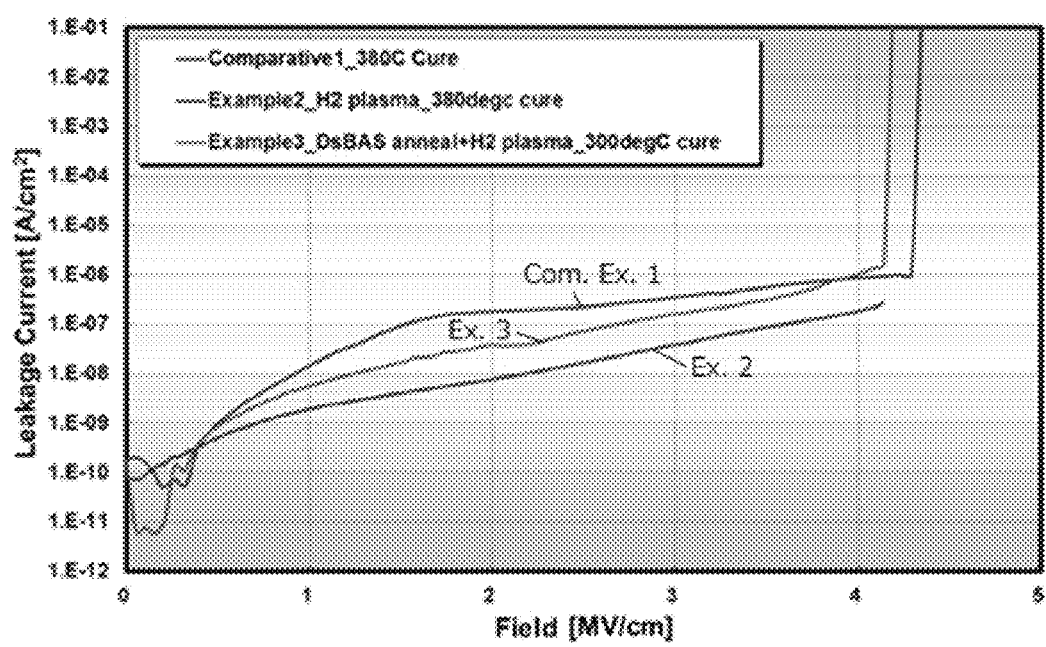
FIG. 4 is a graph showing the relationship between leakage current [A/cm$^2$] and electric field [MV/cm] according to Examples 2 and 3 and Comparative Example 1.
Figure 5:
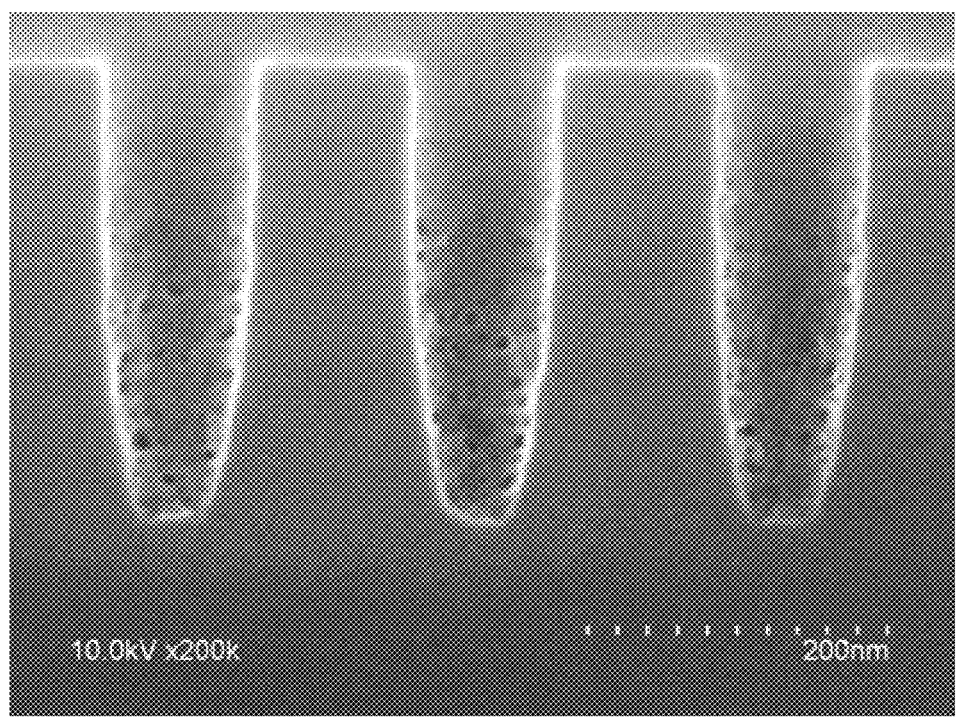
FIG. 5 is a scanning electron microscopy (SEM) photograph showing a cross section of recessed features of a substrate filled with a gap-fill SiOCH film according to Comparative Example 1.

After the UV-curing, film shrinkage was measured. The results are shown in FIG. 2 which is a graph showing the relationship between shrinkage [%] and cure time [sec]. As shown in FIG. 2, the film shrinkage by the UV-curing for 80 seconds was 29.6%. Also, leakage current of the treated film was measured. The results are shown in FIG. 4. FIG. 4 is a graph showing the relationship between leakage current [A/cm$^2$] and electric field [MV/cm]. As shown in FIG. 4, the leakage current was about E-7 A/cm$^2$ at 2 MV/cm. Further, a cross section of the trenches was observed with a scanning electron microscope. FIG. 5 is a scanning electron microscopy (SEM) photograph showing a cross section of the trenches filled with the gap-fill SiOCH film. As shown in FIG. 5, many voids (having a size of, e.g., about 20 nm or greater) formed due to shrinkage were observed.

Comparative Example 2

He Plasma Treatment+High-Temperature UV-Curing

He plasma treatment was conducted on the film-deposited substrate in the same reaction chamber under conditions shown in Table 4 below.

TABLE 4

| | |
|---|---|
| Substrate Temperature | Room temperature |
| Process Pressure | 300 Pa |
| Gas flow of He | 1 SLM |
| RF power | 100 W |
| Distance between electrodes | 8 mm |
| Duration of He plasma treatment | 5 minutes |

After the He plasma treatment, UV-curing was conducted in the same manner as in Comparative Example 1. Thereafter, film shrinkage was measured. The result is shown in FIG. 2 which is a graph showing the relationship between shrinkage [%] and cure time [sec]. As shown in FIG. 2, the film shrinkage by the UV-curing for 80 seconds was 23.6%. The mechanical strength of the film was also measured, and it was 9.0 GPa.

Comparative Example 3

Aminosilane Annealing+High-Temperature UV-Curing

Aminosilane annealing was conducted on the film-deposited substrate in the same reaction chamber under conditions shown in Table 5 below.

TABLE 5

| | |
|---|---|
| Substrate Temperature | Room temperature |
| Aminosilane | Di-sec-buthylaminosilane (DSBAS) |
| Process pressure | 3 Pa |
| Distance between electrodes | 8 mm |
| Duration of He plasma treatment | 5 minutes |

After the aminosilane annealing, UV-curing was conducted under conditions shown in Table 6 below.

TABLE 6

| | |
|---|---|
| Substrate Temperature | 300° C. |
| Process Pressure | 1200 Pa |
| Gas flow of $N_2$ | 4 SLM |
| Distance between Lamp and Substrate | 38 mm |
| UV Lamp | High pressure mercury lamp |
| Duration of UV irradiation | 0 to 500 seconds |

Figure 3:
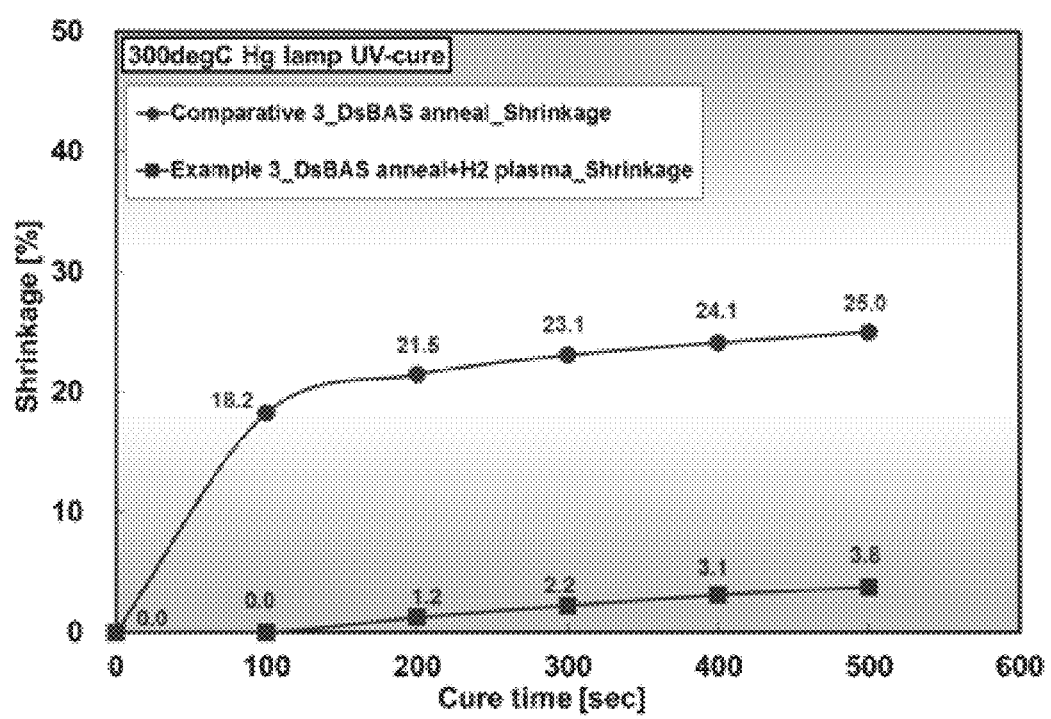
FIG. 3 is a graph showing the relationship between shrinkage [%] and cure time [sec] according to Example 3 and Comparative Example 3.

After the UV-curing, film shrinkage was measured. The result is shown in FIG. 3 which is a graph showing the relationship between shrinkage [%] and cure time [sec]. As shown in FIG. 3, the film shrinkage by the UV-curing for 500 seconds was 25%. The mechanical strength of the film was also measured, and it was 7.8 GPa.

Example 1

$H_2$ Plasma Treatment+High-Temperature UV-Curing $H_2$ plasma treatment was conducted on the film-deposited substrate in the same reaction chamber under conditions shown in Table 7 below.

TABLE 7

| | |
|---|---|
| Substrate Temperature | Room temperature |
| Process Pressure | 500 Pa |
| Gas flow of $H_2$ | 0.35 SLM |
| RF power | 400 W |
| Distance between electrodes | 8 mm |
| Duration of $H_2$ plasma treatment | 5 minutes |

After the $H_2$ plasma treatment, UV-curing was conducted in the same manner as in Comparative Example 2. Thereafter, film shrinkage was measured. The result is shown in FIG. 2 which is a graph showing the relationship between shrinkage [%] and cure time [sec]. As shown in FIG. 2, the film shrinkage by the UV-curing for 80 seconds was 17.7% which was about 25% lower than the film shrinkage when conducting He plasma treatment in Comparative Example 2. The mechanical strength of the film was also measured, and it was 9.2 GPa.

Example 2

$H_2$ Plasma Treatment+High-Temperature UV-Curing $H_2$ plasma treatment was conducted on the film-deposited substrate in the same reaction chamber under conditions shown in Table 8 below.

TABLE 8

| | |
|---|---|
| Substrate Temperature | Room temperature |
| Process Pressure | 1100 Pa |
| Gas flow of $H_2$ | 0.5 SLM |
| RF power | 400 W |
| Distance between electrodes | 8 mm |
| Duration of $H_2$ plasma treatment | 5 minutes |

After the $H_2$ plasma treatment, UV-curing was conducted in the same manner as in Comparative Example 2. Thereafter, film shrinkage was measured. The result is shown in FIG. 2 which is a graph showing the relationship between shrinkage [%] and cure time [sec]. As shown in FIG. 2, the film shrinkage by the UV-curing for 80 seconds was 14.9% which was about 37% lower than the film shrinkage when conducting He plasma treatment in Comparative Example 2. The mechanical strength of the film was also measured, and it was 9.3 GPa.

Figure 6:
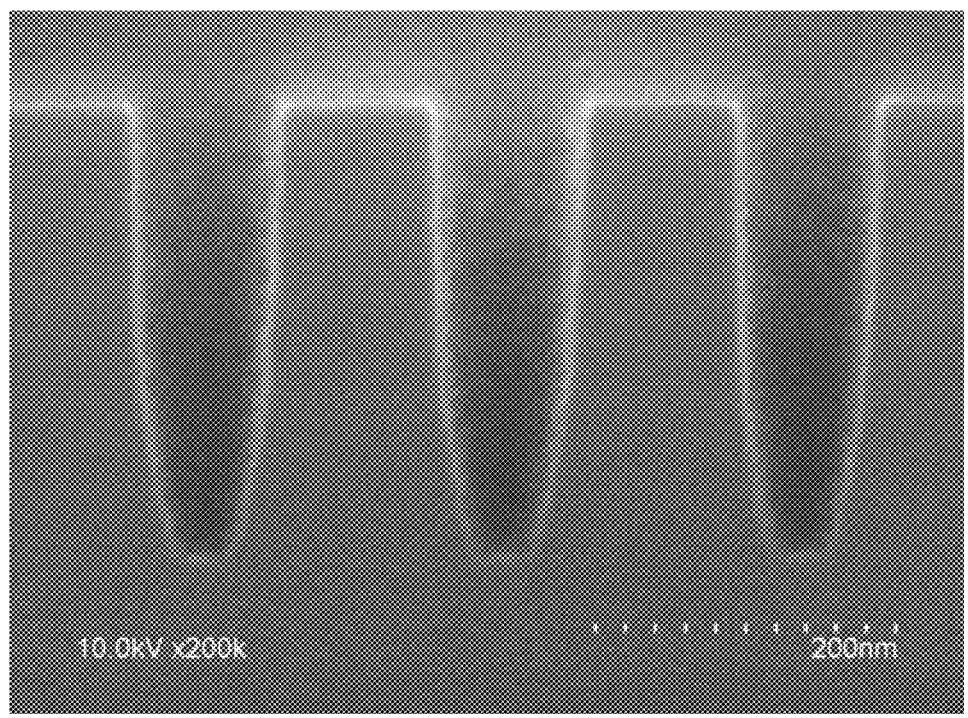
FIG. 6 is a scanning electron microscopy (SEM) photograph showing a cross section of recessed features of a substrate filled with a gap-fill SiOCH film according to Example 2.

Also, leakage current of the treated film was measured. The results are shown in FIG. 4. FIG. 4 is a graph showing the relationship between leakage current [$A/cm^2$] and electric field [MV/cm]. As shown in FIG. 4, the leakage current was about E-8 $A/cm^2$ at 2 MV/cm which was $1/10$ of the leakage current when conducting no $H_2$ plasma treatment in Comparative Example 1. Further, a cross section of the trenches was observed with a scanning electron microscope. FIG. 6 is a scanning electron microscopy (SEM) photograph showing a cross section of the trenches filled with the gap-fill SiOCH film. As shown in FIG. 6, no voids (having a size of, e.g., about 20 nm or greater) formed due to shrinkage were observed.

Example 3

Aminosilane Annealing+$H_2$ Plasma Treatment+High-Temperature UV-Curing

Aminosilane annealing was conducted on the film-deposited substrate in the same reaction chamber under conditions shown in Table 9 below.

TABLE 9

| | |
|---|---|
| Substrate Temperature | Room temperature |
| Aminosilane | Di-sec-buthylaminosilane (DSBAS) |
| Process pressure | 15 Pa |
| Distance between electrodes | 8 mm |
| Duration of He plasma treatment | 60 seconds |

After the aminosilane annealing, $H_2$ plasma treatment was conducted on the film-deposited substrate in the same reaction chamber under conditions shown in Table 10 below.

TABLE 10

| | |
|---|---|
| Substrate Temperature | Room temperature |
| Process Pressure | 1100 Pa |
| Gas flow of $H_2$ | 0.5 SLM |
| RF power | 400 W |
| Distance between electrodes | 8 mm |
| Duration of $H_2$ plasma treatment | 5 minutes |

After the $H_2$ plasma treatment, UV-curing was conducted in the same manner as in Comparative Example 3. Thereafter, film shrinkage was measured. The result is shown in FIG. 3 which is a graph showing the relationship between shrinkage [%] and cure time [sec]. As shown in FIG. 3, the film shrinkage by the UV-curing for 500 seconds was 3.8% which was about 85% lower than the film shrinkage when conducting no H₂ plasma treatment in Comparative Example 3. The mechanical strength of the film was also measured, and it was 7.2 GPa.

Figure 7:
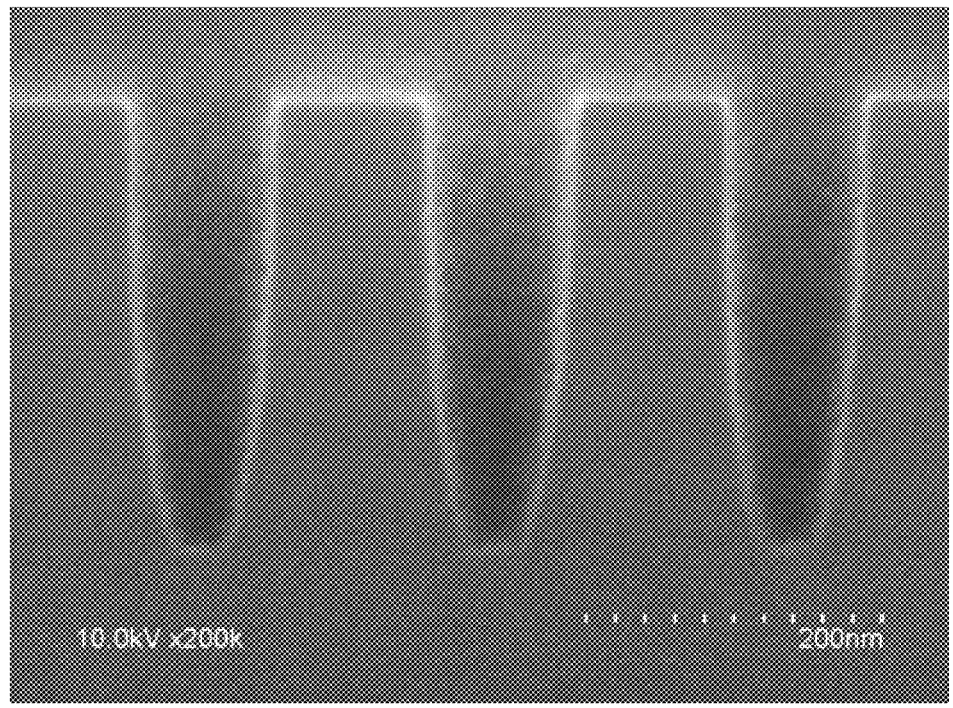
FIG. 7 is a scanning electron microscopy (SEM) photograph showing a cross section of recessed features of a substrate filled with a gap-fill SiOCH film according to Example 3.

Additionally, leakage current of the treated film was measured. The results are shown in FIG. 4. FIG. 4 is a graph showing the relationship between leakage current [$A/cm^2$] and electric field [MV/cm]. As shown in FIG. 4, the leakage current was about 4×E-8 $A/cm^2$ at 2 MV/cm which was less than ½ of the leakage current when conducting no H₂ plasma treatment in Comparative Example 1. Further, a cross section of the trenches was observed with a scanning electron microscope. FIG. 7 is a scanning electron microscopy (SEM) photograph showing a cross section of the trenches filled with the gap-fill SiOCH film. As shown in FIG. 7, no voids (having a size of, e.g., about 20 nm or greater) formed due to shrinkage were observed.

As shown above, it is understood that prior to high-temperature UV-curing, by applying hydrogen plasma (or further with inert gas plasma), a gap-fill SiOCH film which exhibits low shrinkage and good film properties and mechanical strength can be formed on a patterned surface of a substrate.

It will be understood by those of skill in the art that numerous and various modifications can be made without departing from the spirit of the present invention. Therefore, it should be clearly understood that the forms of the present invention are illustrative only and are not intended to limit the scope of the present invention.

We claim:

1. A method for forming a gap-fill SiOCH film on a patterned substrate, comprising:
   (i) providing a substrate having recessed features on its surface;
   (ii) filling the recessed features of the substrate with a SiOCH film which is flowable and non-porous;
   (iii) after completion of step (ii), exposing the SiOCH film to a plasma including a hydrogen plasma; and then
   (iv) curing the plasma-exposed SiOCH film with UV light emitted from a UV lamp.

2. The method according to claim 1, wherein in step (iii), the hydrogen plasma is a plasma of a hydrogen-containing gas.

3. The method according to claim 2, wherein the hydrogen-containing gas is a gas containing hydrogen in its molecule, which gas is at least one selected from the group consisting of H₂, CH₄, C₂H₆, C₃H₈, C₄H₁₀, C₂H₂, C₂H₄, and NH₃.

4. The method according to claim 1, wherein in step (iii), the plasma further comprises an inert gas plasma.

5. The method according to claim 4, wherein the inert gas plasma is a plasma of nitrogen gas and/or rare gas.

6. The method according to claim 5, wherein the rare gas is He, Ar, Ne, Kr, and/or Xe.

7. The method according to claim 1, wherein in step (iii), the plasma consists of a hydrogen plasma.

8. The method according to claim 1, wherein the substrate is loaded on a susceptor, and a temperature of the susceptor is controlled at −10° C. to 50° C. in step (iii).

9. The method according to claim 8, wherein the temperature of the susceptor in step (iii) is room temperature or lower.

10. The method according to claim 1, wherein the substrate is placed between electrodes, and in step (iii), the plasma is generated by applying RF power between the electrodes at a power of 0.07 W to 3 W per cm² of the substrate.

11. The method according to claim 1, wherein in step (iii), the substrate is placed between electrodes, and a distance between the electrodes is about 6 mm to about 27 mm.

12. The method according to claim 1, wherein step (iii) is conducted under a pressure of 100 Pa to 1 ATM.

13. The method according to claim 1, in step (ii), the SiOCH film is formed by flowable CVD, ALD, or spin coating.

14. The method according to claim 1, wherein steps (ii) and (iii) are conducted in the same reaction chamber.

15. The method according to claim 1, wherein step (iv) is conducted at a temperature of about 300° C. and about 400° C.

16. The method according to claim 1, wherein the recessed features are constituted by grooves formed between tungsten wiring lines.

17. A method for forming a gap-fill SiOCH film on a patterned substrate, comprising:
   (i) providing a substrate having recessed features on its surface;
   (ii) filling the recessed features of the substrate with a SiOCH film which is flowable and non-porous;
   (iii) after completion of step (ii), exposing the SiOCH film to a plasma including a hydrogen plasma; and
   (iv) curing the plasma-exposed SiOCH film with UV light, said method further comprising, after completion of step (ii) but prior to step (iii), exposing the SiOCH film to aminosilane gas without a plasma.

* * * * *